US006551762B1

(12) United States Patent
Gaignou et al.

(10) Patent No.: US 6,551,762 B1
(45) Date of Patent: Apr. 22, 2003

(54) PROCESS FOR MANUFACTURING A FLEXOGRAPHIC PRINTING PLATE

(75) Inventors: Alain Gaignou, Dardilly (FR); André Schirrer, Tassin la Demi Lune (FR)

(73) Assignee: Sagadev, Pompey (FR)

( * ) Notice: Subject to any disclaimer, the term of this patent is extended or adjusted under 35 U.S.C. 154(b) by 0 days.

(21) Appl. No.: 09/701,211

(22) PCT Filed: May 27, 1999

(86) PCT No.: PCT/FR99/01252

§ 371 (c)(1), (2), (4) Date: Feb. 26, 2001

(87) PCT Pub. No.: WO99/61248

PCT Pub. Date: Dec. 2, 1999

(30) Foreign Application Priority Data

May 27, 1998 (FR) .......................................... 98 06864

(51) Int. Cl.[7] .............................. G03F 7/00; G03F 7/11

(52) U.S. Cl. ......................... 430/302; 430/306; 430/945

(58) Field of Search ................................ 430/302, 306, 430/945

(56) References Cited

U.S. PATENT DOCUMENTS 3,661,660 A * 5/1972 Wessells et al. .............. 156/14
4,994,344 A * 2/1991 Kurtz et al. ................ 430/273
5,766,819 A * 6/1998 Blanchet-Fincher ........ 430/201
5,925,500 A * 7/1999 Yang et al. ................. 430/300
6,030,751 A * 2/2000 Ellis et al. .................. 430/302
6,146,792 A * 11/2000 Blanchet-Fincher et al. ... 430/7

FOREIGN PATENT DOCUMENTS

| | | |
|---|---|---|
| DE | 507827 | 8/1996 |
| EP | 0315152 | 5/1989 |
| EP | 0640043 | 3/1995 |
| EP | 0640044 | 3/1995 |
| WO | WO 9323252 | 11/1993 |

* cited by examiner

*Primary Examiner*—Janet Baxter
*Assistant Examiner*—Amanda C. Walke
(74) *Attorney, Agent, or Firm*—Gary M. Cohen

(57) ABSTRACT

A layer of a blank is subjected to a laser-engraving phase to manufacture a flexographic printing plate. The layer is produced in a material comprised of between 55 and 65% by weight of ethylene and between 35 and 45% by weight of propylene, which has been cured prior to the laser-engraving phase, and the laser-engraving phase is performed with a laser operating at a wavelength ranging between 248 and 340 nm. Processing steps such as exposure to ultraviolet radiation and crosslinking can, in this way, be eliminated.

14 Claims, 1 Drawing Sheet

PROCESS FOR MANUFACTURING A FLEXOGRAPHIC PRINTING PLATE

BACKGROUND OF THE INVENTION

The present invention relates to a process for manufacturing a flexographic printing plate.

As is known, a flexographic printing plate comprises a printing form which is made of a material exhibiting a certain amount of compressibility. The resulting structure makes it easier to transfer ink from the printing form to flexible surfaces such as board, paper, polyethylene sheets, etc.

Processes for manufacturing flexographic printing plates involving a laser-etching phase are known. Such processes are described, for example, in EP-A-0 640 043 and EP-A-0 640 044, which disclose that an uncured photopolymer layer, possibly deposited on a flexible support layer, can be covered with an upper layer to constitute a preform. The upper layer, which can be etched using a laser, can be formed, for example, of carbon black. Also disclosed is the use of $CO_2$ lasers and solid-state lasers emitting in the infrared range, such as an Nd:YAG laser, to etch the upper layer of the preform.

The etching phase is then followed by exposure of the photopolymer layer to ultraviolet radiation, making the photopolymer layer accessible through the etched layer. This is then followed by crosslinking of the photopolymer layer, which tends to cure the regions that have been subjected to the ultraviolet radiation. The uncured regions are then removed.

However, this known process has a number of drawbacks resulting from the need to carry out complementary steps of exposure to ultraviolet radiation and of crosslinking. As a result, such a process is costly and lengthy. These steps additionally require the use of chemical solvents, which are the source of consequent pollution.

SUMMARY OF THE INVENTION

In accordance with the present invention, a process is provided for manufacturing a flexographic printing plate which serves to alleviate the above-mentioned drawbacks.

To this end, a process is provided for manufacturing a flexographic printing plate in which a layer of a preform is subjected to a laser-etching phase. The layer is made of a material that has been cured before the laser-etching phase, and the laser-etching phase is carried out using a laser that operates at a wavelength of between 200 and 400 nm.

The process of the present invention makes it possible to achieve the above-mentioned objectives by helping to overcome problems resulting from an upper layer attached to the top of the photopolymer material which can be etched by the laser. In accordance with the present invention, the laser-etching face is instead produced directly on the cured material.

In addition, the photopolymer material is subjected to the laser-etching phase after having been cured, rather than before being subjected to curing, as was previously the case. This dispenses with the ultraviolet-exposure and crosslinking phases which were used in the prior process. As a result, when compared with the prior process, the process of the present invention is very advantageous in terms of cost, duration and pollution, especially chemical pollution. The process of the present invention is essentially mechanical, since it does not use the photochemical treatment steps used in the prior process, but rather is carried out by physical machining of the cured material.

Advantageously, the etching phase is carried out at a wavelength of between 248 and 340 nm. The etching phase can be carried out with an excimer laser and with an Nd:YAG laser. Because an Nd:YAG laser usually operates at wavelengths slightly above 1064 nm, it is convenient to bring the frequency of the Nd:YAG laser back into the range which is suitable for implementing the process of the present invention using known techniques which employ harmonic generators to double, triple or quadruple the frequency, correspondingly dividing the emission wavelength by the same factor.

The material which is cured before the etching phase is advantageously made of an EPT (ethylene-propylene terpolymer) material. The EPT material comprises between 55 and 65% by weight of ethylene and between 35 and 45% by weight of propylene, and is filled to between 20 and 40% by weight. The etching phase is carried out with a fluence of between 2 and 4 $J/cm^2$, preferably between 2.5 and 3 $J/cm^2$.

Non-limiting examples of the process of the present invention are further described below, with reference to the following drawings.

DETAILED DESCRIPTION OF THE INVENTION

Figure 1:
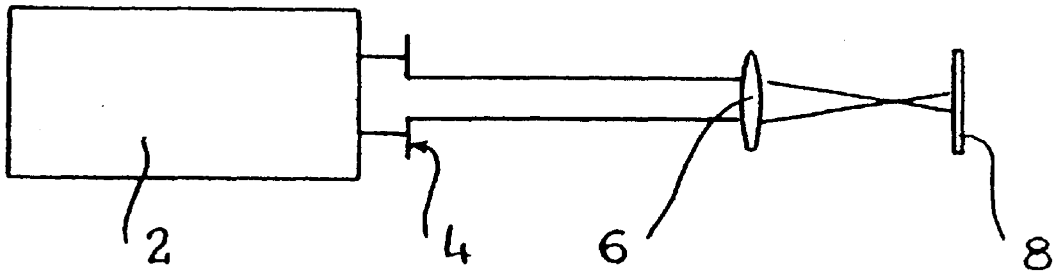
FIG. 1 is a schematic illustration of an apparatus for implementing the process of the present invention.

FIG. 1 illustrates an apparatus for carrying out the process of the present invention. The apparatus is comprised of a laser 2 operating at a wavelength of between 200 and 400 nm. A mask 4 is placed at the exit of the laser 2. The mask 4 has a rectangular aperture which selects the most homogeneous part of the beam delivered by the laser. A lens 6 is placed on the axis of the delivered beam, making it possible to reproduce the image of the mask 4 on a preform 8 which is intended to form a flexographic printing plate. The distance separating the lens 6 from the laser 2 can be modified to vary the energy surface density, or fluence, at the surface of the preform 8.

Figure 2:
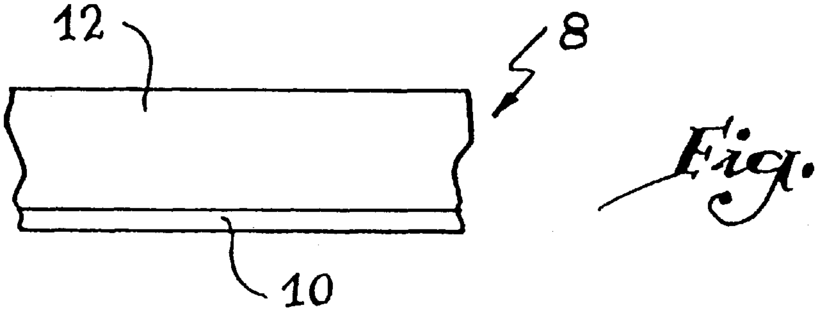
FIGS. 2 to 4 are schematic illustrations of three successive phases of the method for implementing the process of the present invention.

As is shown more specifically in FIG. 2, the preform 8 includes a bottom layer 10, for mechanical support. The bottom layer 10 can be made, for example, of MYLAR™. The support layer 10 receives a cured layer 12. Mutual attachment of the support layer 10 and the cured layer 12 can be provided, for example, by pressing and/or adhesive bonding.

Figure 3:
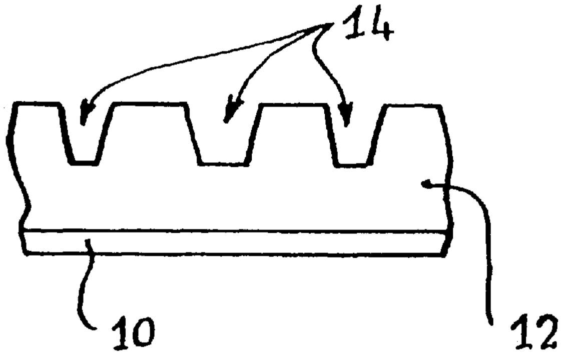

The action of the laser on the cured layer 12 is shown in FIG. 3. The laser forms recesses 14, at suitable places, by ablation at the face of the cured polymer 12 which is on the opposite side from the support layer 10. The depth of these recesses is, for example, between 500 and 1000 micrometers.

Figure 4:
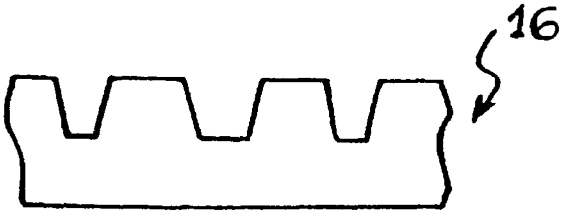

After the recesses 14 have been produced within the cured layer 12, the support layer 10 is removed from the cured layer 12 so that the cured layer 12 then constitutes a flexographic printing plate 16 obtained using the process of the present invention. It should be noted that such a plate 16, shown in FIG. 4, is immediately available after the laser-etching phase. Previously, the etching phase was followed by several ultraviolet exposure phases, a curing phase, and solvent-etching and stabilization phases.

The foregoing description, given with particular reference to FIGS. 2 to 4, discusses only a single cured layer provided on a support layer. A preform which is formed from several cured layers, the upper layer of which is subjected to the action of the laser, can also be produced to form a multilayer flexographic printing plate.

An example of a method for implementing the process of the present invention will now be described which uses a translucent sheet as the cured layer 12. The translucent sheet is formed from an EPT (ethylene-propylene terpolymer) compound such as the product which is sold by Exxon under the designation VISTALON 504. This EPT compound is crosslinked by PERCADOX BC.

The translucent sheet has a relative density of 1.01, an abrasion of 90 $mm^3$ under 10 N, a Shore Hardness A of 65, a tensile strength of 100 $DaN/cm^2$, an elongation at break of 500% and an approximately uniform thickness of about 2 mm. The sheet is fastened to a support layer, similar to that denoted by the reference number 10 in FIGS. 2 to 4. The support layer is made of MYLAR™, having a thickness of about 0.1 mm.

The resulting preform was first subjected to the action of an excimer laser, such as a Lambda Physics Model LPX 220 laser, having an active medium based on krypton fluoride and emitting a 20 ns pulse at 248 nm.

The depth of ablation as a function of fluence, namely the surface energy density at the cured layer intended to be etched, was first studied. This was accomplished by subjecting the layer to 200 shots of the above-described laser, operating at a frequency of 10 hertz. It should be noted that the depth of ablation is a maximum for a fluence value of about 2.8 $J/cm^2$.

The etching phase was then carried out with a fluence value close to the above-mentioned maximum, namely, 2.6 $J/cm^2$. Variation in the depth of the resulting recesses as a function of the total amount of energy delivered to the surface of the cured layer 12 was then studied (as a function of the number of laser shots). It should be noted that a depth of 100 micrometers, which is sufficient for obtaining a flexographic printing plate of satisfactory quality, is obtained for an energy of about 600 $J/cm^2$.

The mass removed as a result of the laser's operation was also measured. To do this, the above-mentioned laser was used with a fluence of 3.5 $J/cm^2$. It has been found that the mass removed by ablation was 10.21 micrograms per shot and that the corresponding value was 0.0099 $mm^3$.

In parallel, the same experiment was conducted using an excimer laser, such as a Lambda Physics Model LPX 220 laser, having an active medium based on xenon chloride and emitting at 308 nm. The apparatus of FIG. 1 was configured so that the laser can operate with a fluence of 4.2 $J/cm^2$. It has been found that the mass removed by ablation at the cured layer 12 was 21.37 micrograms per shot and that the corresponding volume was 0.0207 $mm^3$. This, therefore, means that the loss of material is more sensitive to a wavelength of 308 nm than to a wavelength of 248 nm.

Finally, a comparative study was carried out to estimate the time needed to remove a thickness of 0.1 cm by ablation from a 10×10 cm sector of the above-described sheet. The comparative study was performed using each of the two lasers identified previously, operating at 248 nm and 308 nm, respectively. For this study, both of the lasers were set up under identical operating conditions, namely, an energy of 2 J, a frequency of 500 hertz, a mean power of 1000 watts and a fluence of 3.5 $J/cm^2$. It has been found that 3 minutes, 25 seconds, were necessary to carry out the above-mentioned ablation when operating at 248 nm, whereas 2 minutes, 3 seconds, were sufficient with a laser operating at 308 nm.

What is claimed is:

1. A process for manufacturing a flexographic printing plate using an Nd:YAG laser, comprising the steps of:

providing a preform having a layer made of a cured material comprised of between 55 and 65% by weight of ethylene and between 35 and 45% by weight of propylene; and subjecting the previously cured material of the preform layer to a laser-etching phase by operating the Nd:YAG laser at a wavelength of between 248 and 340 nm.

2. The process of claim 1 wherein the laser is operated at a wavelength of about 308 nm during the laser-etching phase.

3. The process of claim 1 which further includes the step of curing the material forming the preform layer before the laser-etching phase.

4. The process of claim 1 wherein the material forming the preform layer is EPT (ethylene-propylene terpolymer).

5. The process of claim 1 wherein the cured material of the preform layer is filled to between 20 and 40% by weight.

6. The process of claim 1 which further includes the step of operating the laser at a fluence of between 2 and 4 $J/cm^2$ during the laser-etching phase.

7. The process of claim 6 wherein the laser is operated at a fluence of between 2.5 and 3 $J/cm^2$ during the laser-etching phase.

8. A process for manufacturing a flexographic printing plate using an Nd:YAG laser, comprising the steps of:

providing a preform having a layer made of a cured polymer material; and subjecting the cured material of the preform layer to a laser-etching phase by operating the Nd:YAG laser at a wavelength of between 200 to 400 nm.

9. The process of claim 8 wherein the laser is operated at a wavelength of between 248 and 340 nm.

10. The process of claim 8 which further includes the step of curing the material forming the preform layer before the laser-etching phase.

11. The process of claim 8 wherein the material forming the preform layer is EPT (ethylene-propylene terpolymer).

12. The process of claim 8 wherein the cured material of the preform layer is filled to between 20 and 40% by weight.

13. The process of claim 8 which further includes the step of operating the laser at a fluence of between 2 and 4 $J/cm^2$ during the laser-etching phase.

14. The process of claim 13 wherein the laser is operated at a fluence of between 2.5 and 3 $J/cm^2$ during the laser-etching phase.

* * * * *